(12) United States Patent
Kenyon et al.

(10) Patent No.: US 12,446,476 B2
(45) Date of Patent: Oct. 14, 2025

(54) METHOD FOR MANUFACTURING A MEMORY RESISTOR DEVICE

(71) Applicant: UCL Business Ltd., London (GB)

(72) Inventors: Anthony Kenyon, London (GB); Adnan Mehonic, London (GB); Wing Ng, London (GB)

(73) Assignee: UCL Business Ltd., London (GB)

( * ) Notice: Subject to any disclaimer, the term of this patent is extended or adjusted under 35 U.S.C. 154(b) by 539 days.

(21) Appl. No.: 17/778,383

(22) PCT Filed: Nov. 20, 2020

(86) PCT No.: PCT/GB2020/052967
§ 371 (c)(1),
(2) Date: May 19, 2022

(87) PCT Pub. No.: WO2021/099798
PCT Pub. Date: May 27, 2021

(65) Prior Publication Data
US 2022/0416163 A1 Dec. 29, 2022

(30) Foreign Application Priority Data
Nov. 22, 2019 (GB) ..................... 1917071

(51) Int. Cl.
*H10N 70/00* (2023.01)
*H10B 63/00* (2023.01)
(52) U.S. Cl.
CPC .......... *H10N 70/023* (2023.02); *H10B 63/80* (2023.02); *H10N 70/063* (2023.02); *H10N 70/841* (2023.02); *H10N 70/883* (2023.02)

(58) Field of Classification Search
CPC .................................................. H01N 70/023
See application file for complete search history.

(56) References Cited

U.S. PATENT DOCUMENTS

| 9,018,037 B1 | 4/2015 | Nardi et al. |
| 10,043,943 B2 | 8/2018 | Kwon et al. |

(Continued)

FOREIGN PATENT DOCUMENTS

| CN | 101504969 A | 8/2009 |
| GB | 2561168 A | 10/2018 |
| WO | 2016/143960 A1 | 9/2016 |

OTHER PUBLICATIONS

Combined Search and Examination Report from counterpart British Application No. 1917071.1, dated Apr. 23, 2020, 10 pp.

(Continued)

*Primary Examiner* — William A Harriston
(74) *Attorney, Agent, or Firm* — Shumaker & Sieffert, P.A.

(57) ABSTRACT

A method for manufacturing a memory resistor device. A first layer of a dielectric material is deposited onto a first electrode. A subsection of the first layer of the dielectric material is removed to expose one or more edges of the dielectric material and a second layer of the dielectric material is deposited to create one or more boundaries between the one or more edges of the first layer of the dielectric material and the second layer of the dielectric material. A second electrode is provided, wherein the one or more boundaries between the one or more edges of the first layer of the dielectric material and the second layer of the dielectric material extend at least partially from the first electrode to the second electrode.

17 Claims, 3 Drawing Sheets

(56) References Cited

U.S. PATENT DOCUMENTS

| | | |
|---|---|---|
| 2009/0191367 A1 | 7/2009 | Chen |
| 2009/0283735 A1 | 11/2009 | Li et al. |
| 2013/0095634 A1 | 4/2013 | Takahashi et al. |
| 2014/0291602 A1* | 10/2014 | Kenyon ................ H10N 70/24 257/4 |
| 2015/0279905 A1* | 10/2015 | Lin ....................... H10N 70/24 257/5 |
| 2017/0117466 A1 | 4/2017 | Chang et al. |
| 2020/0043550 A1* | 2/2020 | Kenyon ............... H10N 70/026 |

OTHER PUBLICATIONS

International Search Report and Written Opinion of International Application No. PCT/GB2020/052967, dated Feb. 10, 2021, 14 pp.

\* cited by examiner

METHOD FOR MANUFACTURING A MEMORY RESISTOR DEVICE

This application is a national stage application under 35 U.S.C. § 371 of PCT Application No. PCT/GB2020/052967, filed Nov. 20, 2020, which claims the benefit of Great Britain Application No. 1917071.1, filed Nov. 22, 2019. The entire contents of each of PCT Application No. PCT/GB2020/052967 and Great Britain Application No. 1917071.1 are incorporated herein by reference.

TECHNICAL FIELD

The invention relates primarily, but not exclusively, to memory resistor devices and methods of manufacturing memory resistor devices.

BACKGROUND

Memory resistor devices are devices which include multiple conductive states in which a resistance across the device (i.e. between electrodes of the device) is different. Memory resistors further have the ability to maintain, or remember, their last resistance state even when there is no bias voltage applied. Consequently, memory resistors have found uses as non-volatile memory devices, sometimes referred to as resistive random-access memory (RRAM).

Some memory resistor devices are manufactured using dielectric materials which facilitate the formation of conductive filaments between electrodes. The formation of the conductive filaments allows the memory resistor device to achieve multiple conductive states as the conductive filaments can be created or destroyed through the application of a particular voltage bias.

The conductive filaments can form due to inhomogeneities in the dielectric material included in the memory resistor device. Inhomogeneities of the dielectric material can be created in a number of different ways. For example, the dielectric material can be deposited using sputtering techniques, as these typically result in columnar growth of the dielectric material. Alternatively, providing a rough or textured electrode surface can similarly promote columnar growth of the dielectric material.

There is a desire for improved methods of manufacturing memory resistor devices.

SUMMARY OF THE INVENTION

Aspects of the invention are set out in the accompanying claims.

In a first aspect of the invention there is a provided a method for manufacturing a memory resistor device, the method comprising: depositing a first layer of a dielectric material onto a first electrode; removing a subsection of the first layer of the dielectric material to expose one or more edges of the dielectric material; depositing a second layer of the dielectric material to create one or more boundaries between the one or more edges of the first layer of the dielectric material and the second layer of the dielectric material; and providing a second electrode, wherein the one or more boundaries between the one or more edges of the first layer of the dielectric material and the second layer of the dielectric material extend at least partially from the first electrode to the second electrode.

Thus, according to the invention there is provided a method for manufacturing a memory resistor device which includes boundaries between different domains of a dielectric material in predefined locations. The locations of the boundaries are determined by the removal of the first layer of the dielectric material. That is, the boundaries are located at the regions in which the first layer and the second layer of dielectric material interface. These boundaries act as efficient nucleation centres for the formation of conductive filaments.

As such, a memory resistor device in which conductive filaments can be reliably produced can be manufactured, wherein the location and extent of conductive filaments in the memory resistor device can be controlled. Accordingly, the memristive properties of the memory resistor device can be controlled and predicted to a greater extent relative to comparable methods, thereby providing consistency between use cycles as well as providing improved device-to-device uniformity in switching between different resistance states. As a consequence of this precise control and consequent improved consistency, of the memristive properties of the memory resistive device, the manufactured device can be smaller in size than has previously been achievable.

Advantageously, removing a subsection of the first layer of the dielectric material comprises creating one or more pillars of the first layer of the dielectric material. For example, the one or more pillars may take the form of cylindrical pillars, cuboidal pillars or any other shapes of pillar. Such an arrangement allows the boundaries between the first and second layers of dielectric material (and hence the conductive filaments which form at these locations) to be confined to easily-definable locations.

In some aspects, removing a subsection of the first layer of the dielectric material comprises creating or one or more voids in the first layer of the dielectric material. For example, the one or more voids may be cylindrical in shape, cuboidal in shape or any other suitable shape. Such an arrangement allows the boundaries between the first and second layers of dielectric material (and hence the conductive filaments which form at these locations) to be confined to easily-definable locations.

In some aspects, the one or more boundaries between the one or more edges of the first layer of dielectric material and the second layer of the dielectric material are located within a bulk of the dielectric material. That is, the boundaries are not exposed to ambient conditions but are wholly encapsulated by the dielectric material. Accordingly, the conductive filaments which can be formed at the boundaries are protected from degradation caused by operation in varying environmental conditions.

Advantageously, removing a subsection of the first layer of the dielectric material comprises exposing a portion of a top surface of the first electrode. Accordingly, the boundaries between the first and second layers of the dielectric material extend to the first electrode, such that conductive filaments which form at the boundaries extend to the first electrode.

Advantageously, removing the subsection of the first layer of the dielectric material comprises removing the subsection of the first layer of the dielectric material using plasma etching. As such, desired portions and shapes of dielectric material can be reliably and efficiently removed.

In some aspects, the method further comprises lithographically defining the subsection of the first layer of the dielectric material to be removed. The shape and size of the portions of the dielectric material to be removed can thus be effectively defined. The techniques may use various forms of lithography, such as optical lithography or electron beam lithography.

Advantageously, the method further comprises, prior to providing the second electrode, performing a planarisation process comprising removing a portion of the second layer of the dielectric material. As such, a memory resistor device with a flat surface of dielectric material can be manufactured.

In such aspects, performing the planarisation process may further comprise: depositing a layer of buffer material onto the second layer of the dielectric material; and removing the layer of buffer material. The provision of the buffer material allows the top surface of the device to be flattened before any etching or removal, as part of the planarisation, is begun. As such, subsequent removal of the buffer material and potentially further dielectric material results in a flat film of dielectric material.

In particular, the buffer material results in the production of a flat top surface. Accordingly, if the material of the device is etched in a uniform manner (i.e. maintaining a flat top surface) then the buffer material and a portion of one or more of the first and second layers of dielectric material can be removed whilst maintaining a flat top surface.

Advantageously in this aspect, the buffer material may be a dielectric material. For example, the buffer material may be silicon oxide (SiOx) or hydrogen silsesquioxane (HSQ). The buffer material may be chosen to have the same etch rate as the dielectric material forming the first and second layers to provide a flat dielectric surface after the removal of the buffer material and potentially further dielectric material.

In some aspects, the dielectric material is silicon oxide (SiOx). Advantageously, the dielectric material is deposited using atomic layer deposition (ALD) or chemical vapour deposition (CVD). These deposition techniques can deposit homogeneous layers of the dielectric material. Accordingly, the dielectric material of the final memory resistor device will be generally free of internal boundaries except for those deliberately created between the first and second layers of the dielectric material. Therefore, the presence of conductive filaments in the dielectric material can be generally confined to predefined desired regions, allowing a high degree of control over the memristive properties of the memory resistor device.

In some aspects, the method further comprises depositing one or more additional layers of material, the one or more additional layers of material being one or more of: deposited between the first electrode and the first layer of the dielectric material; deposited between the first layer of the dielectric material and the second layer of the dielectric material; and deposited between the second layer of the dielectric material and the second electrode. As an example, the one or more additional layers could include aluminium oxide, however other layers could be deposited depending on the particular application of the device. Accordingly, complex final structures can be produced whilst creating internal boundaries in predefined regions. As such, devices with predictable and repeatable memristive properties can be produced for a wide variety of applications.

Furthermore, between deposition steps the structures may be exposed to particular atmospheres and/or conditions to alter the chemical properties of the surfaces. For example, the edges of the first layer of dielectric material may be annealed and/or exposed to a hydrogen, forming gas, ammonia, or chlorine atmosphere (chemically passivating the column surfaces) to change the chemical properties of the edges, depending on the particular application of the device. As such, devices with predictable and repeatable memristive properties can be produced for a wide variety of applications.

In an example there is provided a memory resistor device manufactured according to any of the methods described above. Advantageously, the one or more boundaries between the one or more edges of the first layer of the dielectric material and the second layer of the dielectric material include one or more nano-scale columns of the dielectric material. The nano-scale columns of the dielectric material act as nucleation centres for the formation of conductive filaments within the dielectric material, which affect the memristive properties of the memory resistor device. Accordingly, the conductive filaments can be formed in predefined regions of the dielectric material, providing predictable memristive properties.

Advantageously, the one or more boundaries between the one or more edges of the first layer of the dielectric material and the second layer of the dielectric material extend fully from the first electrode to the second electrode. As such, conductive filaments can form which extend between the two electrodes of the memory resistor device, thereby having a determinable length. As such, the memristive properties of the memory resistor device can be more predictable relative to comparative devices.

In a third aspect there is provided a memory resistor device, the memory resistor device comprising: a first electrode; a second electrode; a first homogeneous portion of dielectric material disposed between the first electrode and the second electrode; and a second homogeneous portion of dielectric material disposed between the first electrode and the second electrode; wherein one or more boundaries between the first dielectric material and the second dielectric material extend at least partially from the first electrode to the second electrode.

Thus, according to the invention there is provided a memory resistor device in which includes boundaries between different domains of a dielectric material which are confined to predefined locations determined by the boundaries between the first and second layers of the dielectric material. As such, conductive filaments will generally form at these boundaries preferentially, relative to other locations within the dielectric material.

Therefore, the extent and location of conductive filaments which form in the memory resistor device is predictable, meaning the memristive properties of the memory resistor device can be controlled and predicted to a greater extent relative to comparable devices.

BRIEF DESCRIPTION OF THE DRAWINGS

Embodiments of the invention will now be described, by way of example only, with reference to the following figures.

In accordance with one (or more) embodiments of the present invention the Figures show the following.

Any reference to prior art documents in this specification is not to be considered an admission that such prior art is widely known or forms part of the common general knowledge in the field.

As used in this specification, the words "comprises", "comprising", and similar words, are not to be interpreted in an exclusive or exhaustive sense. In other words, they are intended to mean "including, but not limited to".

The invention is further described with reference to the following examples. It will be appreciated that the invention as claimed is not intended to be limited in any way by these examples. It will be further recognised that the skilled reader will understand from the teaching herein that integers and features of different embodiments may be used in any suitable and advantageous combination.

DETAILED DESCRIPTION OF THE DRAWINGS

Some comparative methods of manufacturing memory resistor devices involve promoting the formation of conductive pathways (or filaments) in a dielectric material between two electrodes, where the conductive filaments form in the presence of a voltage bias. The formation of conductive pathways between electrodes lowers the resistance of the memory resistor device. Furthermore, the conductive pathways are not destroyed once the voltage bias has been removed and as such the memory resistor device is maintained in the same resistance state once the voltage bias has been removed.

The conductive pathways generally form at regions of inhomogeneity in the dielectric material and can include, for example, particles or clusters of semiconductor material with the dielectric layer. Often, these inhomogeneities take the form of columnar structures within the dielectric material. Columnar structures of the dielectric material act to form the conductive pathway in response to the application of an electroforming voltage to the electrodes of a memory resistor. In particular, the boundaries between the column structures have a lower density than the surrounding regions of the dielectric material, and this may encourage the formation of a conductive pathway at such boundaries, as the boundaries act as effective nucleation centres for the formation of conductive pathways between electrodes.

FIGS. 1-6 show steps in an example method for manufacturing a memory resistor device 100 which includes controllable and well-defined inhomogeneities at which conductive filaments can form.

Figure 1:
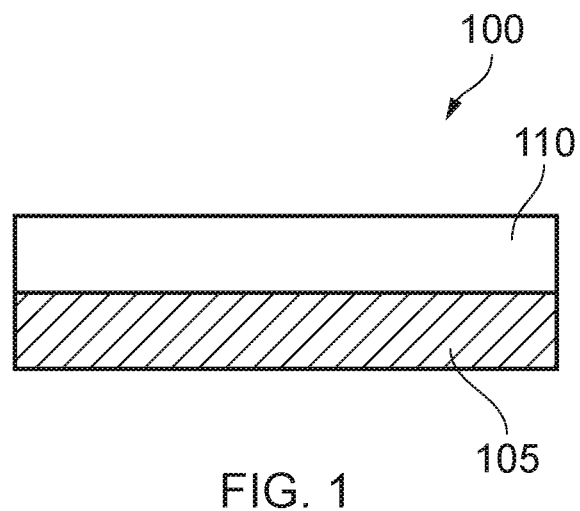
FIG. 1 illustrates a first step of an example method for manufacturing a memory resistor device.

FIG. 1 shows a first step of the example method. In this step, a first layer 110 of a dielectric material is deposited onto an electrode 105. The dielectric material could, for example, be silicon oxide (SiOx) or any other dielectric material suitable for use in memory resistor devices, such as silicon nitride, silicon carbide or silicon oxynitride, however non-silicon-based material may also be used.

The dielectric material may be deposited, for example, using atomic layer deposition (ALD) as this technique typically produces a uniform amorphous layer of the dielectric material, however other techniques, such as chemical vapour deposition (CVD) or sputtering, could be used. The dielectric layer may be, for example, less than 50 nm in thickness, for example between 10 nm-30 nm thick.

The electrode 105 may be formed of molybdenum or any other suitable material, such as silicon (polycrystalline or crystalline), indium tin oxide (ITO), titanium nitride (TiN), graphene, zinc oxide, tin oxide, and metals such as gold, silver, copper, titanium, tungsten, aluminium, platinum and chromium, however this is not an exhaustive list. The electrode may, in some examples, have a low surface roughness, for example a root mean square (rms) roughness of below 1 nm. Furthermore, the dielectric layer may be deposited directly onto the surface of the electrode 105, or one or more intermediate layers, such as a wetting layer, could be deposited before the dielectric layer.

Figure 2:
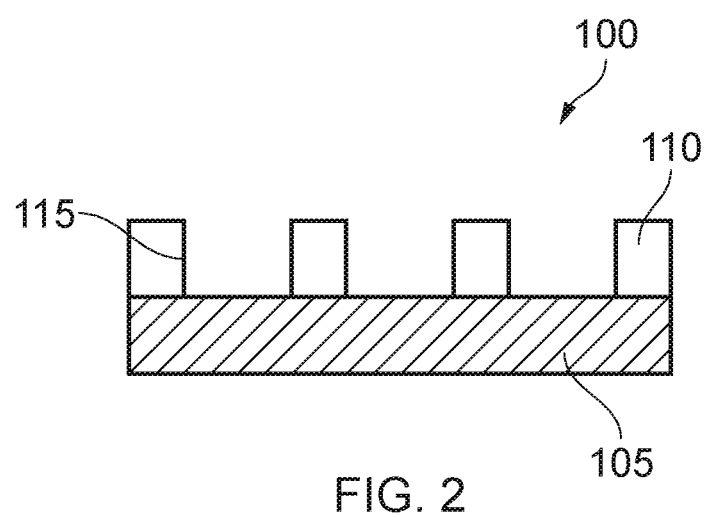
FIG. 2 illustrates a second step of an example method for manufacturing a memory resistor device.

FIG. 2 shows a second step of the example method. In this step, a subsection of the first layer 110 of the dielectric material is removed (or etched). In this manner, one or more edges 115 of the dielectric material are exposed to ambient conditions.

The portions of the first layer 110 which are removed in this step can be defined, for example, using lithographic techniques such as optical lithography or electron beam lithography, in combination with a suitable beam resist. However, other suitable techniques for defining the portions of the first layer 110 to be removed may be used instead. The selected portions of the first layer 110 can be removed using plasma etching or other techniques for removing the dielectric material (any remaining beam resist is also removed after the first layer 110 has been etched).

The first layer 115 can be etched to produce one or more pillars of dielectric material. These pillars may extend to the surface of the electrode 105, as shown in FIG. 2, such that the surface of the electrode 105 is exposed between the pillars, or alternatively dielectric material may remain between the pillars. In some examples the pillars may be approximately 10 nm-500 nm wide.

As an alternative to the production of pillars, or in combination with the production of pillars, etching can be used to produce one or more voids in the dielectric material. These voids may extend to the surface of the electrode 105 or may extend only partially to the electrode 105.

Figure 3:
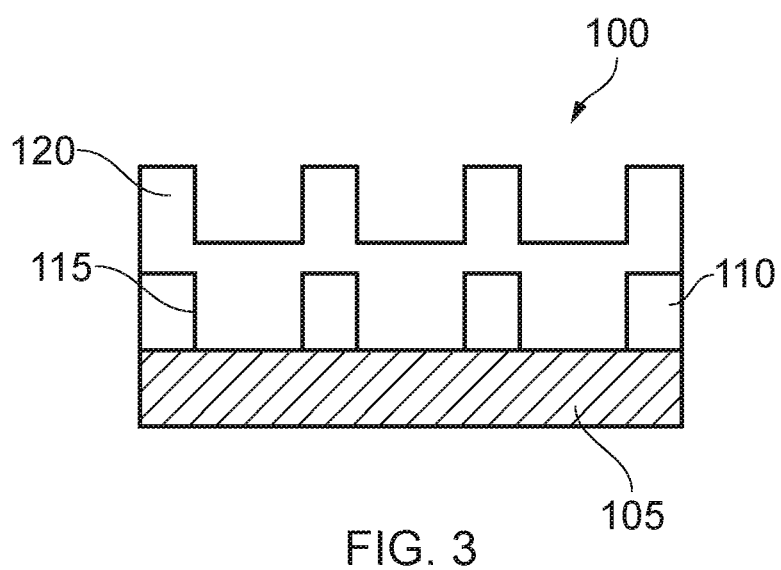
FIG. 3 illustrates a third step of an example method for manufacturing a memory resistor device.

FIG. 3 shows a third step of the example method. In this step, a second layer 120 of the dielectric material is deposited. In this manner, one or more boundaries are created between the one or more edges 115 of the first layer 110 of the dielectric material and the second layer 120 of the dielectric material. These boundaries generally contain columnar structures which are encapsulated by dielectric material (i.e. not exposed to ambient conditions), due to the boundaries existing at the edges of the first layer of dielectric material.

The second layer 120 may be deposited using the same deposition technique as the first layer 110. In this manner, while the dielectric material includes inhomogeneities at the boundaries between the first layer 110 and the second layer 120, the dielectric material is otherwise generally homogenous. Accordingly, interfaces between domains of the dielectric material will generally predominantly be present at the boundaries between the first layer 110 and the second layer 120, and not elsewhere within the layers 110, 120. As such, conductive filaments will preferentially form at the boundaries between the layers. In some examples, conductive filaments will generally only form at the boundaries between the layers.

ALD results in conformal coverage of the deposition surface and as such, an uneven dielectric top surface can result when using this technique to deposit the second layer. For example, as shown in FIG. 3, the second layer 120 of the dielectric material may be thicker than the first layer 110 in order to 'overfill' the etched regions. Alternatively, the second layer 120 of the dielectric material may be thinner than the first layer 110 in order to 'underfill' the etched regions.

Furthermore, prior to depositing the second layer 120, one or more intermediate layers may first be deposited between the first dielectric layer 110 and the second dielectric layer 120. These intermediate layers could, for example, include an aluminium oxide layer or substantially any other material, dependent on the particular application of the final device.

Figure 4:
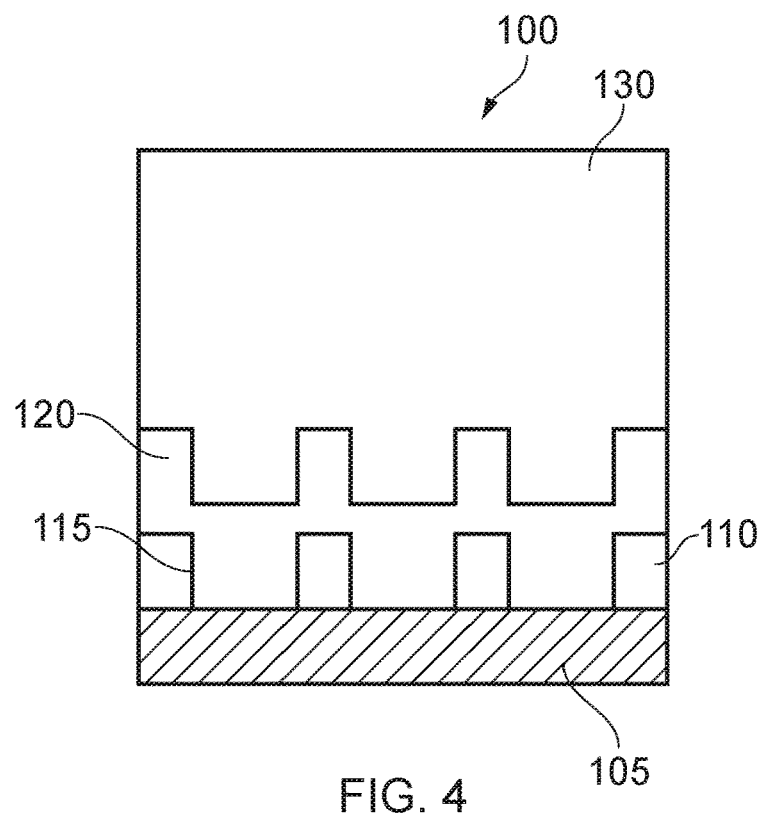
FIG. 4 illustrates a fourth step of an example method for manufacturing a memory resistor device.

FIG. 4 shows an optional fourth step of the example method, and a first step of an optional planarisation process. The preceding steps of the example method may, depending on the parameters used, produce an uneven top surface of the dielectric portion. If a dielectric portion with a flat top surface is desired, a planarisation process may be performed.

In the example planarisation process, a layer of buffer material 130 (known as a planarisation layer) is deposited onto the device. The buffer material 130 is deposited to achieve a flat top surface. That is, as the thickness of the buffer material 130 increases, the upper surface becomes flatter.

Accordingly, when layers of the device are etched away, a portion of dielectric material with a flat top surface is produced.

The buffer material may be deposited using CVD, however other techniques could be used. The buffer layer may be formed of SiOx or hydrogen silsesquioxane (HSQ). The buffer material may be chosen to have the same etch rate as the dielectric material forming the first and second layers to provide a flat dielectric surface after the removal of the buffer material and potentially further dielectric material.

Figure 5:
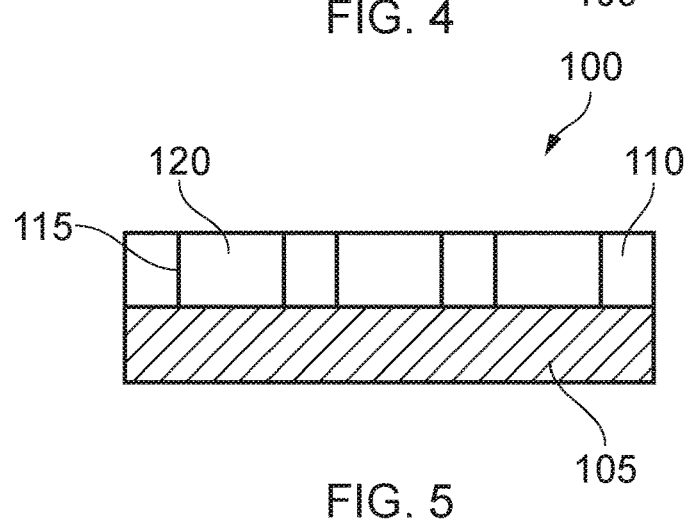
FIG. 5 illustrates a fifth step of an example method for manufacturing a memory resistor device.

FIG. 5 shows an optional fifth step of the example method, and a second step of the optional planarisation process. In this step, the buffer material is etched away (for example using plasma etching) in addition to etching away portions of the first layer 110 and/or second layer 120, depending on whether the etched regions were 'overfilled' or 'underfilled' when depositing the second layer 120. If no buffer material has been used, this step may only involve removing portions of the first layer 110 and/or second layer 120 to achieve flat surface.

The layers of the device may be etched away until the top of the first layer 110 of the dielectric material is reached, thereby producing a dielectric portion with the thickness of the first dielectric later 110. Alternatively, a layer of the second dielectric material may be left at the top of the device (for example if the etched regions were 'overfilled'). Alternatively, the layers of the device may be etched away below the top of the first layer 110 of the dielectric material, in particular if the etched regions were 'underfilled'.

Alternatively, other planarisation techniques may be used to achieve a flat dielectric portion. For example, chemical-mechanical polishing or ion bombardment may be used. Ion bombardment comprises bombarding the top of the dielectric material with an ion beam (for example comprising Argon ions) at a glancing incident angle. This technique preferentially etches protruding features, and thus any protrusions from the surface of the dielectric material (such as those shown in FIG. 3) may be removed to achieve a flat top surface of dielectric material without use of a buffer material and, unlike chemical-mechanical polishing, without requiring sample rotation (and thus is mechanically simpler). Ion bombardment could additionally be used in combination with other planarisation techniques, such as those described above.

Figure 6:
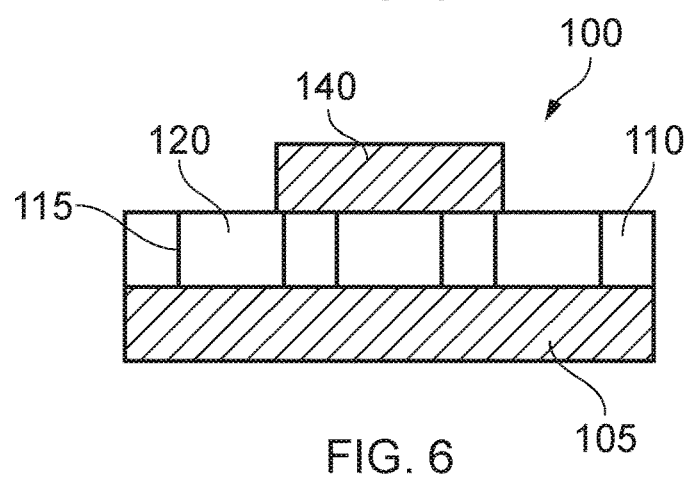
FIG. 6 illustrates a sixth step of an example method for manufacturing a memory resistor device.

FIG. 6 shows a further step of the example method, which can be performed subsequent to the aforementioned third step or subsequent to the aforementioned optional fifth step. In this step, a second electrode 140 is provided on the device. For example, the electrode 140 may be deposited using sputtering or other evaporation techniques, however other means of providing the electrode 140 may be used. The second electrode 140 may, for example, be formed of gold, however other materials such as silicon (polycrystalline or crystalline), indium tin oxide (ITO), titanium nitride (TiN), graphene, zinc oxide, tin oxide, and metals such as, silver, copper, titanium, tungsten, molybdenum, aluminium, platinum and chromium may be used.

The electrode 140 may be more than 100 nm in thickness. Furthermore, a wetting layer (for example of titanium) which may be less than 5 nm thick may be deposited before the electrode 140 to improve adhesion of the electrode to the device 100. The shape of the electrode 140 may be defined using photo- or electron beam lithography and wet (chemical) or dry (plasma) etching, as appropriate. Other electrode 140 structures and materials may be used according to the desired application.

In the final memory resistor device 100, the one or more boundaries between the one or more edges of the first layer 110 of the dielectric material and the second 120 layer of the dielectric material extend at least partially from the first electrode 105 to the second electrode 140. That is, the boundaries are not parallel with the first electrode 105, or with the second electrode 140. The boundaries need not extend fully between the first electrode 105 and the second electrode 140 and could instead extend to only one electrode or to neither of the electrodes. Accordingly, these boundaries can facilitate the formation of conductive filaments which extend at least partially from the first electrode 105 to the second electrode 140.

Accordingly, a memory resistor device 100 including a dielectric layer comprising multiple domains can be manufactured, where inhomogeneities can be created in predefined regions, thereby facilitating the formation of conductive filaments in these regions. Accordingly, precise control of the extent of conductive filament formation within the dielectric layer can be controlled, thereby providing predictability and control over the memristive properties of the device 100, as well as repeatability across usage cycles. Control over these properties is necessary in order to scale the size of memory resistor devices to the sizes involved in modern semiconductor technologies (e.g. below 10 nm) and to provide better device-to-device uniformity of switching between resistance states. Therefore, the present method enables memory resistor devices to be made smaller than comparable manufacturing methods.

Figure 7:
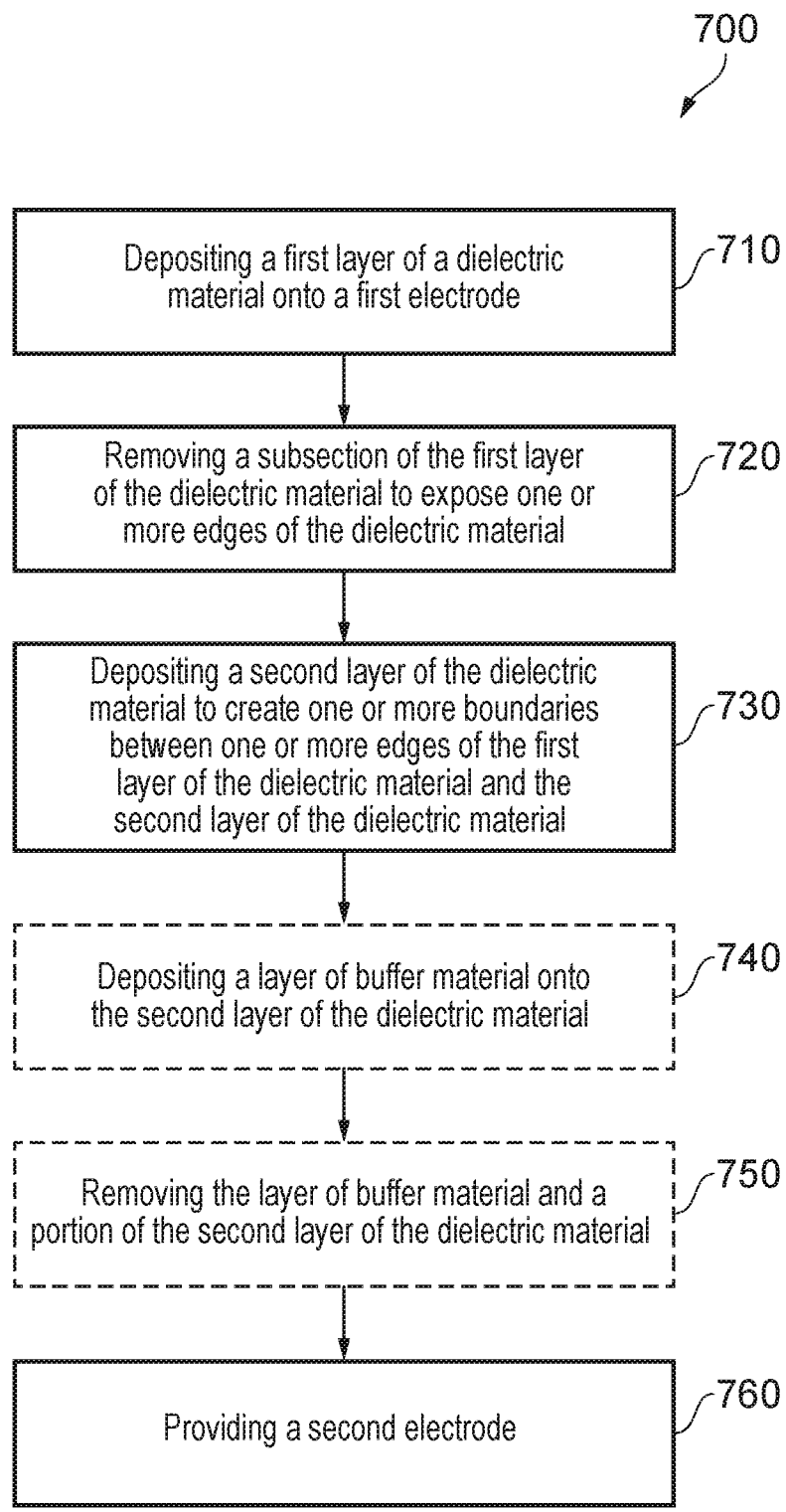
FIG. 7 illustrates a flowchart outlining a method for manufacturing a memory resistor device.

FIG. 7 shows a flowchart outlining a method 700 for manufacturing a memory resistor device. Step 710 comprises depositing a first layer of a dielectric material onto a first electrode. Step 720 comprises removing a subsection of the first layer of the dielectric material to expose one or more edges of the dielectric material. Step 730 comprises depositing a second layer of the dielectric material to create one or more boundaries between the one or more edges of the first layer of the dielectric material and the second layer of the dielectric material.

Step 740 is an optional step forming part of a possible planarisation step and comprises depositing a layer of buffer material onto the second layer of the dielectric material. Step 750 is an optional step forming part of the possible planarisation step and comprises removing the layer of buffer material and a portion of the second layer of the dielectric material.

Step 760 comprises providing a second electrode. Accordingly, the method 700 can provide a memory resistor device in which conductive filaments can be reliably produced can be manufacture, where the location and extent of conductive filaments in the memory resistor device can be controlled by this method. Accordingly, the memristive properties of the memory resistor device can be controlled and predicted to a greater extent relative to comparable methods. This precise control of the memristive properties of the memory resistive device allow the memory resistor device to be smaller in size than has previously been achievable.

The invention claimed is:

1. A method for manufacturing a memory resistor device, the method comprising:
   depositing a first layer of a dielectric material onto a first electrode;
   removing a subsection of the first layer of the dielectric material to expose one or more edges of the dielectric material;
   depositing a second layer of the dielectric material to create one or more boundaries between the one or more edges of the first layer of the dielectric material and the second layer of the dielectric material; and
   providing a second electrode, wherein at least one boundary of the one or more boundaries between the one or more edges of the first layer of the dielectric material and the second layer of the dielectric material intersects with both an edge of the first electrode and an edge of the second electrode.

2. The method of claim 1, wherein removing a subsection of the first layer of the dielectric material comprises creating one or more pillars of the first layer of the dielectric material.

3. The method of claim 1, wherein removing a subsection of the first layer of the dielectric material comprises creating or one or more voids in the first layer of the dielectric material.

4. The method of claim 1, wherein the one or more boundaries between the one or more edges of the first layer dielectric material and the second layer of the dielectric material are located within a bulk of the dielectric material.

5. The method of claim 1, wherein removing a subsection of the first layer of the dielectric material comprises exposing a portion of a top surface of the first electrode.

6. The method of claim 1, wherein removing the subsection of the first layer of the dielectric material comprises removing the subsection of the first layer of the dielectric material using plasma etching.

7. The method of claim 1, further comprising:
   lithographically defining the subsection of the first layer of the dielectric material to be removed.

8. The method of claim 1, further comprising:
   prior to providing the second electrode, performing a planarisation process comprising removing a portion of the second layer of the dielectric material.

9. The method of claim 8, wherein performing the planarisation process further comprises:
   depositing a layer of buffer material onto the second layer of the dielectric material; and
   removing the layer of buffer material.

10. The method of claim 9, wherein the buffer material is a dielectric material.

11. The method of claim 1, wherein the dielectric material is silicon oxide (SiOx).

12. The method of claim 1, wherein the dielectric material is deposited using atomic layer deposition (ALD) or chemical vapour deposition (CVD).

13. The method of claim 1, further comprising depositing one or more additional layers of material, the one or more additional layers of material being one or more of:
   deposited between the first electrode and the first layer of the dielectric material;
   deposited between the first layer of the dielectric material and the second layer of the dielectric material; and
   deposited between the second layer of the dielectric material and the second electrode.

14. The method of claim 1, further comprising chemically passivating the edges of the first layer of dielectric material by exposing the edges of the first layer of dielectric material to an atmosphere one or more gases.

15. A memory resistor device manufactured according to the method of claim 1.

16. The memory resistor device according to claim 15, wherein the one or more boundaries between the one or more edges of the first layer of the dielectric material and the second layer of the dielectric material include one or more nano-scale columns of the dielectric material.

17. A memory resistor device, the memory resistor device comprising:
   a first electrode;
   a second electrode;
   a first homogeneous portion of dielectric material disposed between the first electrode and the second electrode; and
   a second homogeneous portion of dielectric material disposed between the first electrode and the second electrode;
   wherein at least one boundary of the one or more boundaries between the first dielectric material and the second dielectric material intersects with both an edge of the first electrode and an edge of the second electrode.

* * * * *